(12) United States Patent
Yamamoto et al.

(10) Patent No.: US 7,045,909 B2
(45) Date of Patent: May 16, 2006

(54) ALIGNMENT MARK STRUCTURE

(75) Inventors: Yasuhiro Yamamoto, Tokyo (JP);
Takahiro Yamauchi, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/004,105

(22) Filed: Dec. 6, 2004

(65) Prior Publication Data
US 2005/0095802 A1 May 5, 2005

Related U.S. Application Data

(62) Division of application No. 10/700,565, filed on Nov. 5, 2003, now Pat. No. 6,953,733, which is a division of application No. 10/119,320, filed on Apr. 10, 2002, now Pat. No. 6,661,105.

(30) Foreign Application Priority Data

Apr. 13, 2001 (JP) .............................. 2001-115256

(51) Int. Cl.
  *H01L 23/544* (2006.01)
(52) U.S. Cl. .............................. 257/797; 257/E23.179; 438/401; 438/975
(58) Field of Classification Search ...................... None
  See application file for complete search history.

(56) References Cited

U.S. PATENT DOCUMENTS

| | | | |
|---|---|---|---|
| 4,962,318 A | 10/1990 | Nishi | |
| 5,128,283 A | 7/1992 | Tanaka | |
| 5,316,966 A | 5/1994 | Van Der Plas et al. | |
| 5,528,372 A | 6/1996 | Kawashima | |
| 5,847,468 A | 12/1998 | Nomura et al. | |
| 5,859,478 A | 1/1999 | Hagi | |
| 5,925,937 A | 7/1999 | Jost et al. | |
| 5,949,145 A * | 9/1999 | Komuro | 257/797 |
| 5,956,564 A | 9/1999 | Newman et al. | |
| 6,037,671 A | 3/2000 | Kepler et al. | |
| 6,118,185 A * | 9/2000 | Chen et al. | 257/797 |
| 6,140,711 A | 10/2000 | Machida et al. | |
| 6,143,622 A | 11/2000 | Yamamoto et al. | |
| 6,344,698 B1 | 2/2002 | Barr et al. | |
| 6,645,823 B1 | 11/2003 | Fujimoto | |
| 6,670,632 B1 | 12/2003 | Fujimoto | |

FOREIGN PATENT DOCUMENTS

| | | |
|---|---|---|
| JP | 54-012676 | 1/1979 |
| JP | 64-11340 | 1/1989 |
| JP | 4-330710 | 11/1992 |
| JP | 2001-22051 | 1/2001 |

* cited by examiner

*Primary Examiner*—Andy Huynh
(74) *Attorney, Agent, or Firm*—Volentine Francos & Whitt, PLLC

(57) ABSTRACT

A semiconductor substrate having an upper layer and an alignment mark structure formed on a surface region of the upper layer, the surface region defined by opposite first and second parallel sides extending along the upper layer, outer side walls extending upwardly from the upper layer and extending lengthwise along the side, and are defined lengthwise by alternating first and second wall portions, each of the first wall portions is spaced farther from the first side of the surface region than is each of the second wall portions, and an alignment pattern defined by openings in the alignment mark structure.

13 Claims, 8 Drawing Sheets

ALIGNMENT MARK STRUCTURE

CROSS REFERENCE TO RELATED APPLICATIONS

This is a divisional application of application Ser. No. 10/700,565, filed Nov. 5, 2003 now U.S. Pat. No. 6,953,733, which is a divisional application of Ser. No. 10/119,320 filed Apr. 10, 2002, now U.S. Pat. No. 6,661,105, which are hereby incorporated by reference in their entirety for all purposes.

BACKGROUND OF THE INVENTION

1. Field of the Invention

The present invention relates to an alignment mark used in the manufacture of a semiconductor device, and to an aligning method using the alignment mark.

The present application claims priority under 35 U.S.C. §119 to Japanese Patent Application No. 2001-115256, filed Apr. 13, 2001, which is herein incorporated by reference in its entirely for all purposes.

2. Description of the Related Art

An exposure apparatus transfers circuit patterns of a plurality of masks to the surface of a semiconductor substrate. Prior to the exposure process, the exposure apparatus identifies an alignment mark formed on the semiconductor substrate and aligns the mask with reference to the alignment mark.

A conventional alignment mark is defined within a rectangular region and includes a plurality of alignment patterns. The alignment patterns are, for example, plural sets of parallel slits where each set consist of three regularly spaced slits. A laser light is diffracted and scattered by the slits and then detected to identify the alignment mark. And, manufacturing process steps of such the slits having a bump are described below.

In the manufacture of the alignment mark, after a coated layer is formed on the semiconductor substrate, the circuit patterns are transferred to the coated layer by a lithography etching process. At the same time, the alignment mark is formed. Then, another coated layer is formed on the semiconductor substrate having the alignment mark formed thereon, and a photo resist is formed on this other coated layer.

At the exposure apparatus, the alignment mark is irradiated by the laser light, and a movement of the laser light is detected in response to a movement of a stage of the exposure apparatus which positions the semiconductor substrate. Then, a reflected light is diffracted and scattered at the three slits of the alignment mark. The reflected light returns through the same light path and then separates. The separated reflected light is detected by a detector of the exposure apparatus. A position of the alignment mark is recognized from a diffracted light which enters into the detector.

The exposure apparatus corrects an exposure position in accordance with a difference between the recognized position of the alignment mark and an origin of the mask.

However, in the conventional alignment mark, a space between the closest slit of the alignment mark to a side of the rectangular region of the alignment mark and the side may be equal to a space between the three regularly spaced slits. In such cases, the exposure apparatus may incorrectly recognize the diffracting and scattering of light arise from the side of the rectangular region of the alignment mark, as a substitute for the diffracting and scattering of light arising from the 3 regularly spaced slits of the alignment mark.

SUMMARY OF THE INVENTION

It is an objective of the invention to provide an alignment mark and an aligning method using the alignment mark so as to assure a highly accurate alignment without incorrectly recognizing the side of the rectangular region of the alignment mark.

To achieve this object, in a semiconductor substrate having an upper layer and an alignment mark structure formed on a surface region of the upper layer, the surface region defined by opposite first and second parallel sides extending along the upper layer, wherein the alignment mark structure comprises, a first outer side wall extending upwardly from the upper layer and extending lengthwise along the first side of the surface region, wherein the first outer side wall is defined lengthwise by alternating first and second wall portions, wherein each of the first wall portions is spaced farther from the first side of the surface region than is each of the second wall portions, a second outer side wall extending upwardly from the upper layer and extending lengthwise along the second side of the surface region, wherein the second outer side wall is defined lengthwise by alternating third and fourth wall portions, wherein each of the third wall portions is spaced farther from the second side of the surface region than is each of the fourth wall portions, and an alignment pattern defined by openings in the alignment mark structure located between the first and second outer side walls.

According to the present invention, an exposure apparatus can be prevented from incorrectly recognizing the diffracting and scattering of light arising from a side region of an alignment mark. As such, the alignment mark of the present invention allows for more accurate alignment.

The above and further objects and novel features of the invention will more fully appear from the following detailed description, appended claims and accompanying drawings.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings. The drawings used for this description typically illustrate major characteristic parts in order that the present invention will be easily understood.

Figure 1:
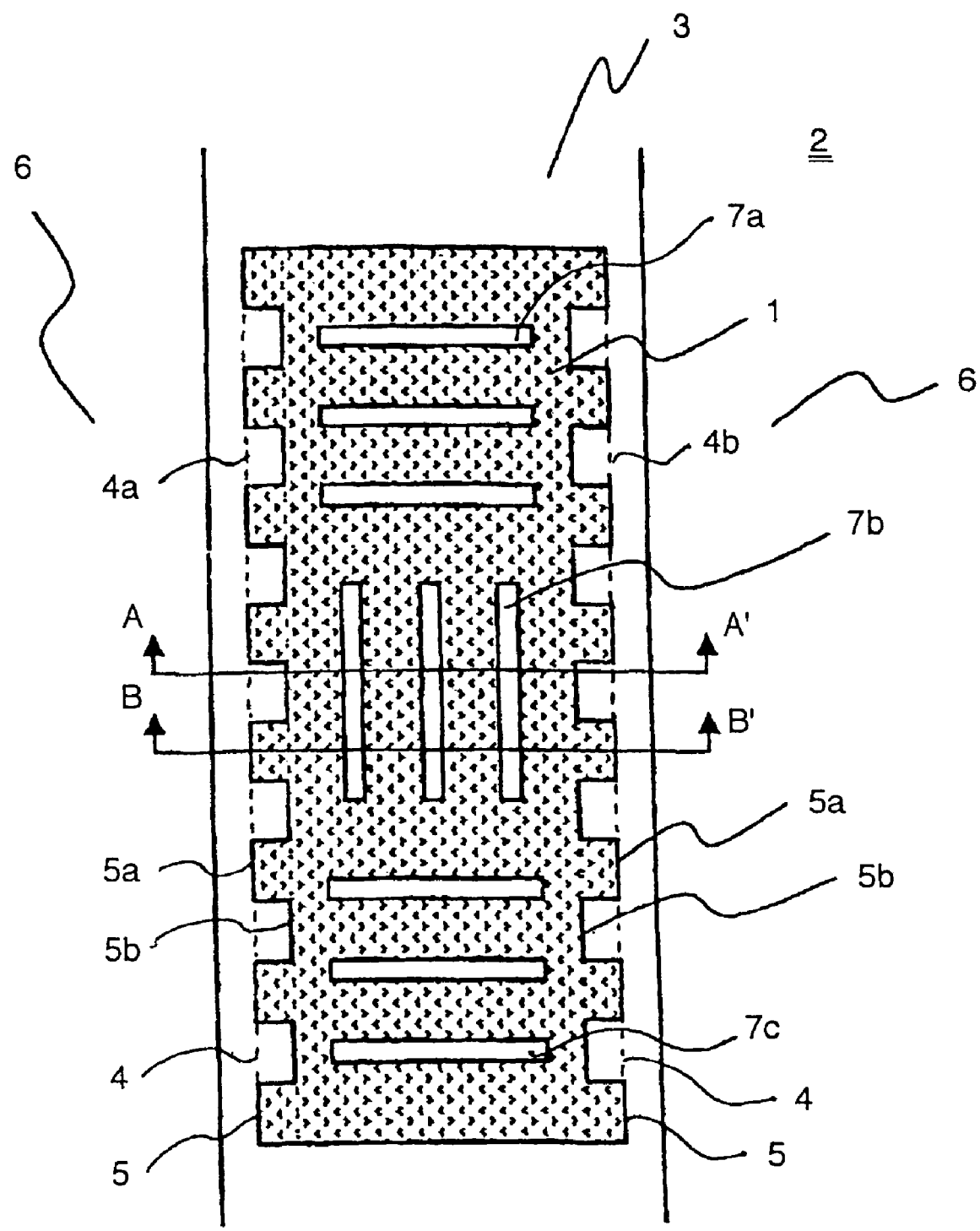
FIG. 1 is a plan view showing an alignment mark structure according to a first preferred embodiment of the present invention.
Figure 2:
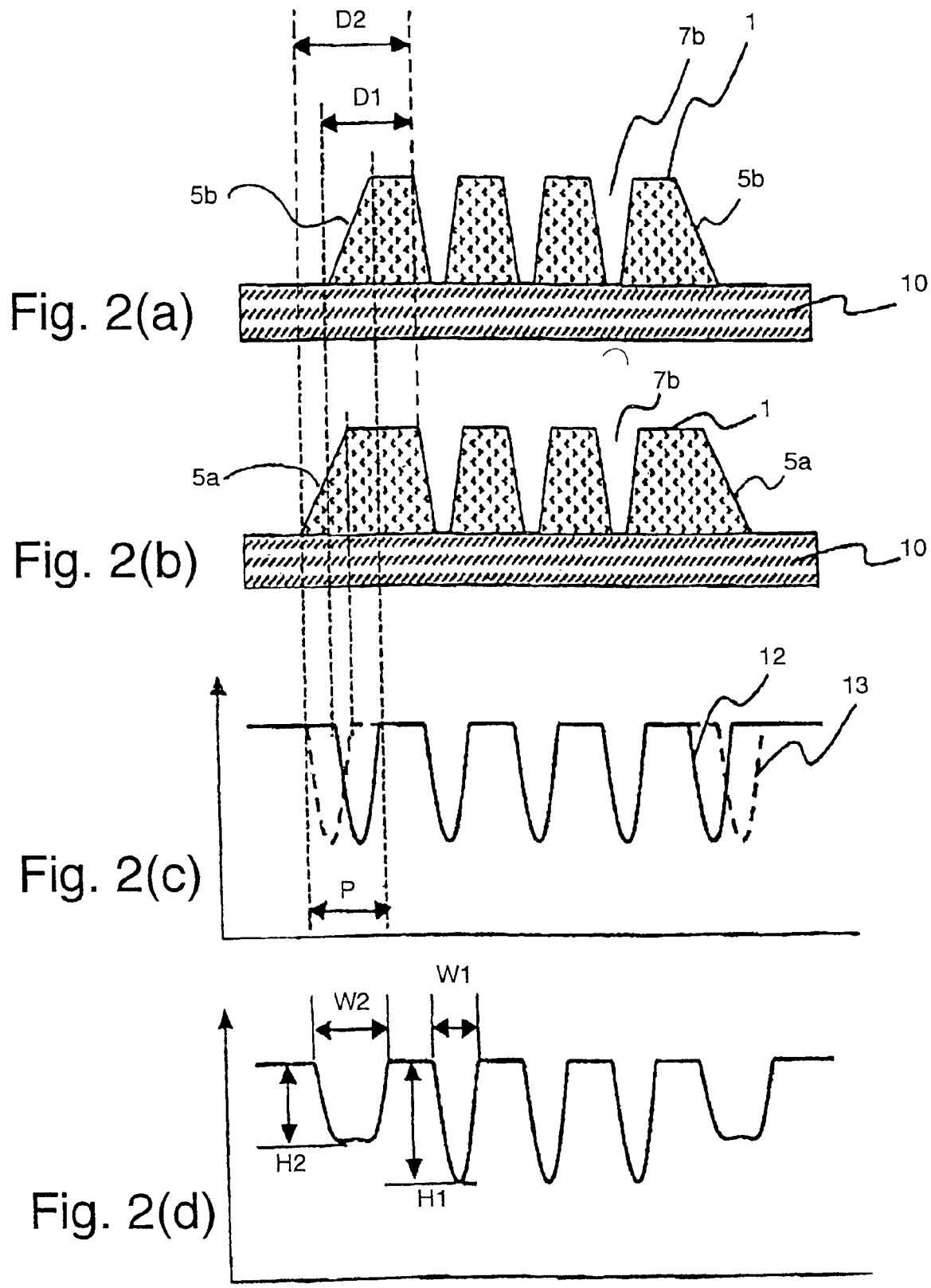
FIGS. 2(a) and 2(b) are cross-sectional views showing the alignment mark structure according to the first preferred embodiment of the present invention.
FIGS. 2(c) and 2(d) illustrate waveforms corresponding to various portions of the alignment mark structure according to the first preferred embodiment of the present invention.

FIG. 1 is a plan view showing an alignment mark structure according to a first preferred embodiment of the present invention. FIGS. 2(a) and 2(b) are cross-sectional views showing the alignment mark structure according to the first preferred embodiment of the present invention. FIGS. 2(c) and 2(d) illustrate waveforms according to various portions of the alignment mark structure according to the first preferred embodiment of the present invention.

Referring to FIG. 1, a semiconductor wafer or substrate 2 includes a generally rectangular surface region 4 on a surface thereof. The rectangular surface region 4 is defined by opposite first and second parallel sides 4a and 4b extending along the surface of the semiconductor substrate 2. Also, as shown in FIG. 1, the rectangular surface region 4 may be defined within a grid-line 3 of the semiconductor substrate 2. Grid-lines are generally used to separate adjacent device regions 6 of the semiconductor substrate 2, and have a width on the order of 100 µm Also, grid-lines are located between adjacent circuit patterns 6. The semiconductor substrate 2 is eventually divided into individual semiconductor devices along the grid-line 3.

An alignment mark structure 1 is formed within the rectangular surface region 4 of the semiconductor substrate 2. In this example, the alignment mark structure 1 is about 180 µm in length, and about 70 µm in width. As shown in FIG. 1, the alignment mark structure 1 includes opposite outer side walls 5 which extend upwardly from the surface of the semiconductor substrate 2, and which extend lengthwise along the first side 4a and second side 4b of the rectangular surface region 4, respectively. Each of the outer side walls 5 is defined along its length by alternating first and second wall portions 5a and 5b. As shown in FIG. 1, each of the first wall portion 5a is spaced closer to the sides (4a or 4b) of the rectangular surface region 4 than is each of the second wall portion 5b. The length of each portion 5a and 5b along a direction of the first and second sides 4a and 4b may be about 5 µm to 10 µm. And, the length of each portion 5a in a direction perpendicular to the direction of the first and second sides 4a and 4b may also be about 5 um to 10 µm. In this manner, the outer side walls 5 are configured with a plurality of concavities and convexities which alternate along the length of the outer side walls 5.

As shown in FIG. 1, an alignment pattern defined by openings in the alignment mark structure 1 is located between the outer side walls 5. In this example, the alignment pattern is defined by plural sub-patterns 7a, 7b and 7c, which are spaced apart and aligned between the outer side walls 5. Further, each sub-pattern 7a, 7b and 7c includes several (e.g., three) regularly spaced and elongate openings extending lengthwise in a direction parallel to each other. In this example, the length of each opening is 40 µm, the width of each opening is about 1 µm to 5 µm, and the openings in each sub-pattern 7a, 7b and 7c are spaced apart by about 12 µm Also, as shown in FIG. 1, the openings of the each sub-pattern 7b extend perpendicularly relative to the openings of each adjacent sub-pattern 7a and 7c. Likewise, the openings of each sub-pattern 7a, 7b and 7c extend either parallel to or perpendicular to the first and second sides 4a and 4b of the rectangular surface region 4 of the semiconductor substrate 2.

FIG. 2(a) is a cross-sectional view along the line A–A' in FIG. 1. FIG. 2(b) is a cross-sectional view along the line B–B' in FIG. 1.

Referring to FIGS. 2(a) and 2(b), reference number 10 denotes an upper layer of the semiconductor substrate 2. The upper layer 10 may be constituted by an upper semiconductor surface, or by one or more layers (electrically conductive, semiconductive and/or insulating) formed atop the upper semiconductor surface.

As shown in FIGS. 2(a) and 2(b), a reference sign D1 indicates a distance between the sub-pattern 7b and the second wall portion 5b of the alignment mark structure 1, and a reference sign D2 indicates a distance between the sub-pattern 7b and the first wall portion 5a of the alignment mark structure 1. The distance D1 is different from the distance D2. That is to say, the distance D1 is shorter than the distance D2.

FIG. 2(c) is an alignment waveform of the alignment mark structure 1. When an alignment is performed using such an alignment mark structure 1, the exposure apparatus averages, for example an image data which in a predetermined region of the alignment mark structure 1, and detects the image data as an alignment waveform of the alignment mark structure 1. In more detail, the exposure apparatus imports the image data of the alignment mark structure 1 and averages the imported image data of the predetermined region. The predetermined region of the alignment mark structure 1 include the first and second wall portions 5a and 5b of the alignment mark structure 1.

As shown in FIG. 2(c), the alignment waveform of region according to the second wall portion 5b showing in FIG. 2(a) is shown by a solid line 12. Also, the alignment waveform of the region according to the first wall portion 5a shown in FIG. 2(b) is shown by a broken line 13. An alignment light strength detected due to the exposure apparatus is shown in a vertical axis. Also, alignment positions of FIGS. 2(a) and 2(b) are shown in a horizontal axis. At this time, the alignment light strength is maximum in a flat region of the alignment mark structure 1.

FIG. 2(d) is an average alignment waveform which includes regions of the first and second wall portions 5a and 5b of the alignment mark structure 1. Since the sub-pattern 7b of the cross-sectional view of the first wall portion 5a and the alignment pattern 7b of the cross-sectional view of the second wall portion 5b are located at the same horizontal position, the average alignment waveforms of both wall portions 5a and 5b are the same. However, since a gap of the alignment waveform arises in a peripheral P of the alignment mark structure 1 in accordance with the first and second portions 5a and 5b, the alignment waveforms of the both wall portions 5a and 5b are compensated.

Therefore, a peak height H2 of the alignment waveform of the peripheral P is shorter than a peak height H1 of the alignment waveform of the sub-pattern 7b. More further, a peak width W2 of the alignment waveform of the peripheral P is wider than a peak width W1 of the alignment waveform of the sub-pattern 7b. As a result, the exposure apparatus can avoid recognizing the diffracting and scattering of light arising from the sides of the alignment mark structure 1, as a substitute for the diffracting and scattering of light arising from the sub-pattern 7b.

According to the first preferred embodiment of the present invention, since a pair of the sides of the alignment mark 1 are consisted such that the first and second wall portions 5a and 5b are alternatively and sequentially located, a spacing from the sub-pattern 7b to the side of the alignment mark structure 1 is different from a spacing between the regularly spaced openings which consist of the sub-pattern 7b. Therefore, the exposure apparatus can correctly carry out an alignment process using the alignment mark structure 1.

Figure 3:
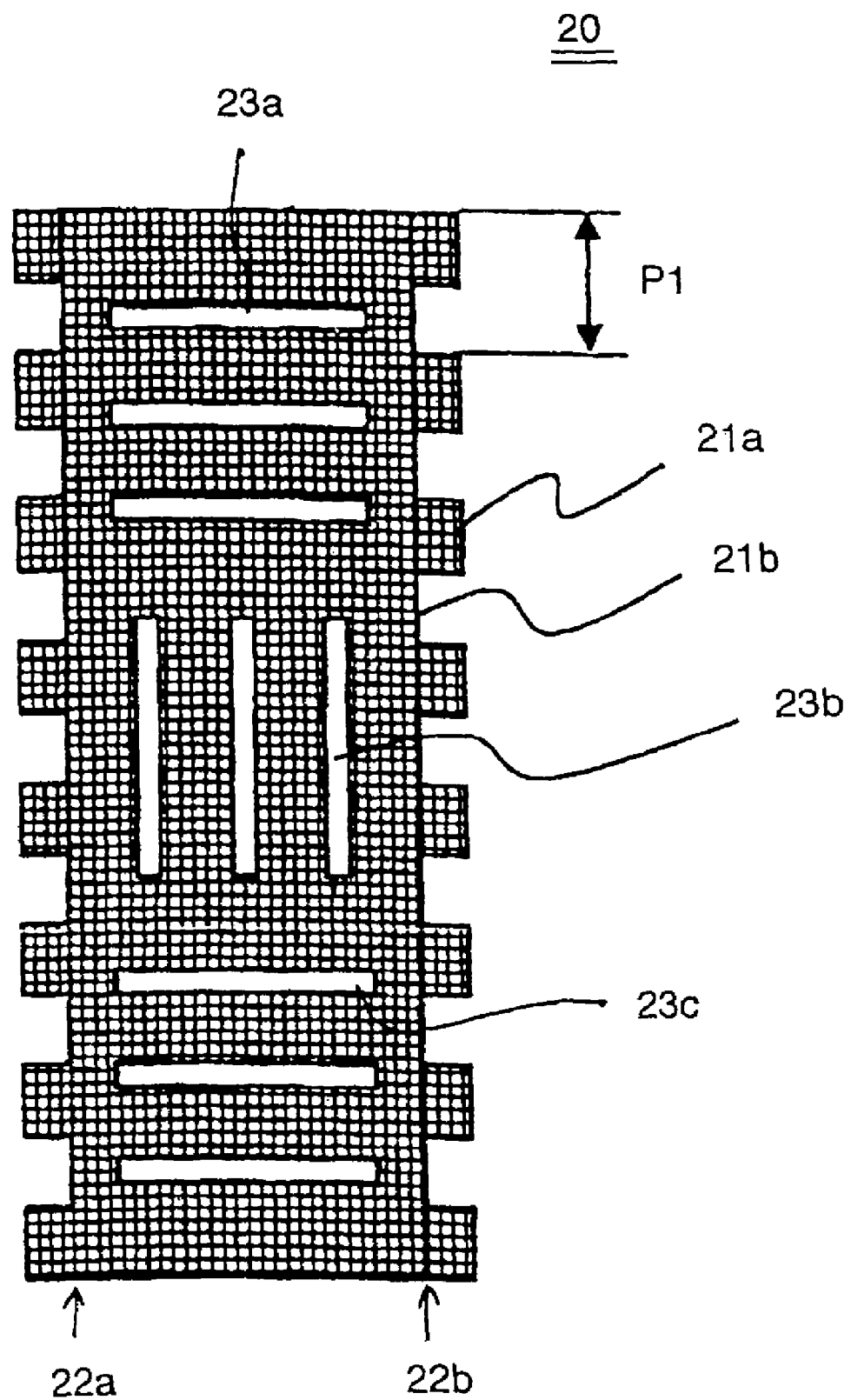
FIG. 3 is a diagram showing a mask pattern according to a second preferred embodiment of the present invention.

FIG. 3 is a diagram showing a mask pattern according to a second preferred embodiment of the present invention. This embodiment relates to a mask pattern of an exposure mask, and more particularly, a mask pattern 20 of the alignment mark region shown in FIG. 3. The mask pattern 20 is defined within a substantially rectangular region defined by opposite first and second parallel sides 22a and 22b. The first and second sides 22a and 22b of the mask pattern 20 have first and second portions 21a and 21b which are alternately and sequentially located. A pitch P which is consisted with a pair of first and second portions 21a and 21b is set under a resolution limit of the exposure apparatus. For example, when the resolution of the exposure apparatus is 0.50 μm the pitch P is set about 0.20 μm to 0.30 μm More further, the mask pattern 20 has a plurality of apertures 23a, 23b and 23c corresponding to the sub-patterns 7a, 7b and 7c, respectively.

Figure 6:
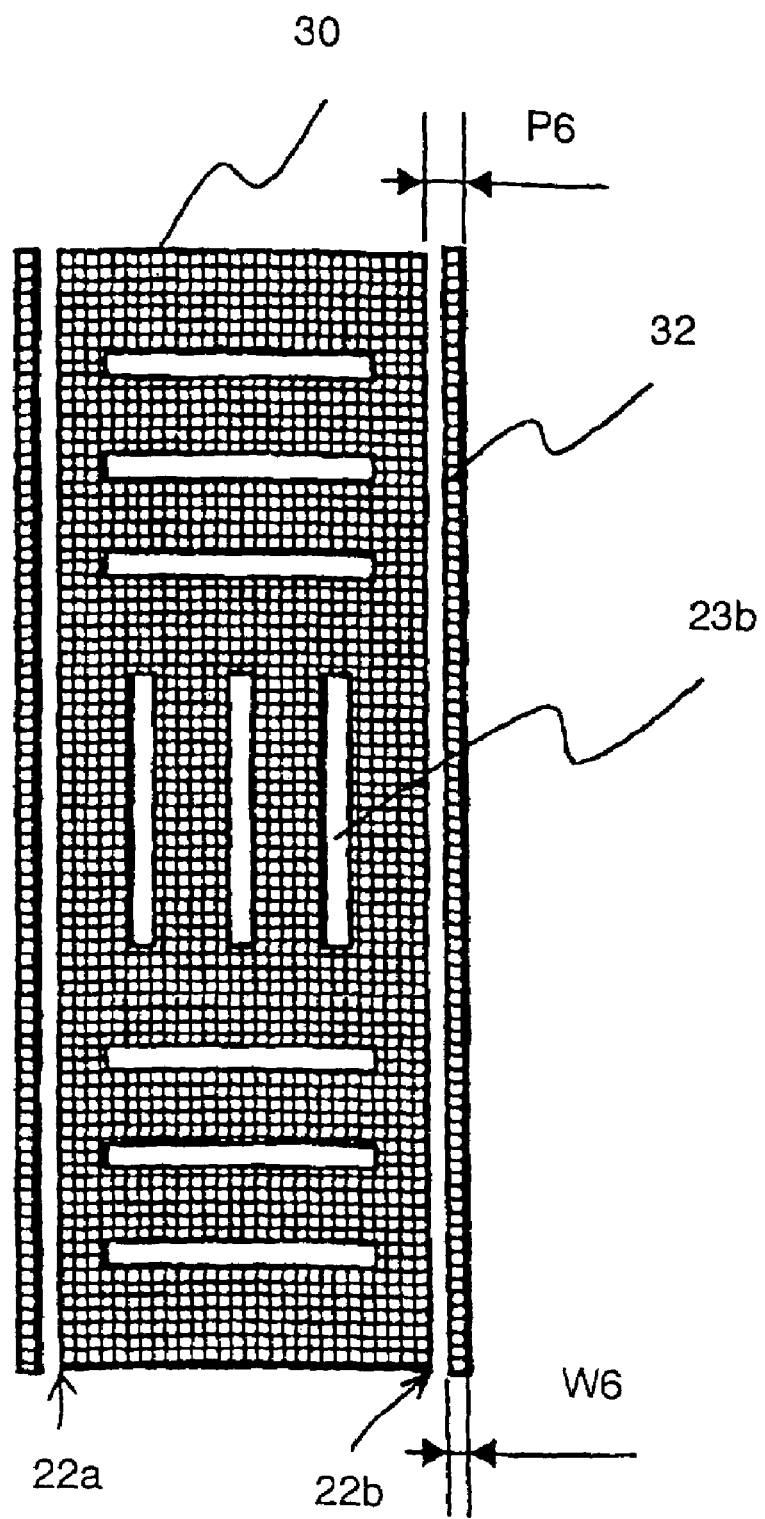
FIG. 6 is a diagram showing an another mask pattern according to the second preferred embodiment of the present invention.

FIG. 6 is a diagram showing an another mask pattern according to the second preferred embodiment of the present invention. Similar to the mask pattern shown in FIG. 3, the exposure mask which is an alignment mark region of a mask pattern 30. A line pattern 32 is formed along the side of the mask pattern 30. A pitch P6 is a space between the side of the mask pattern 30 and the line pattern 32. A width W6 of the line pattern 32 and the pitch P6 are set under a resolution limit of the exposure apparatus. Therefore, the side region of an alignment mark is formed as a gradual bump.

Figure 7:
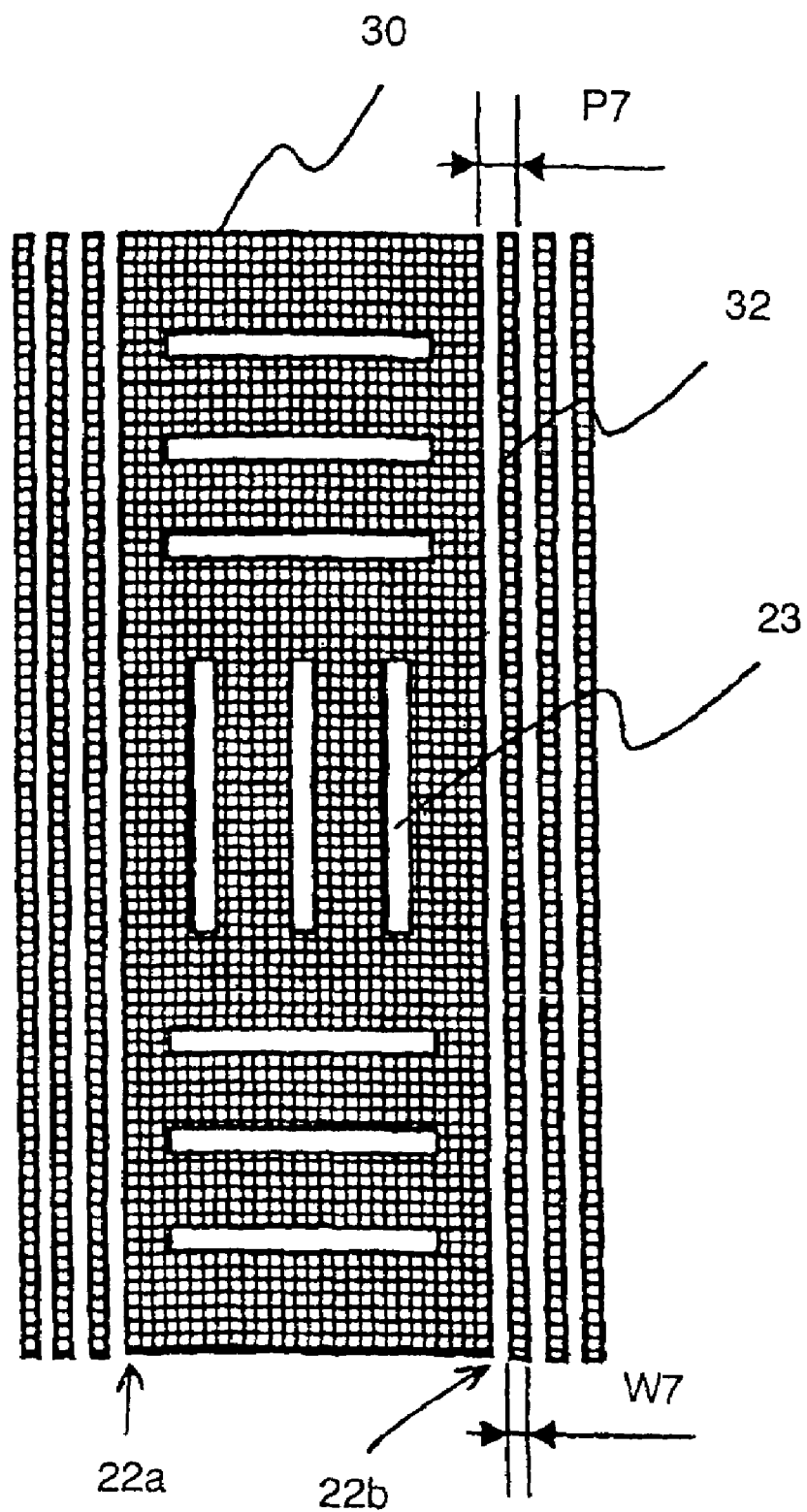
FIG. 7 is a diagram showing an another mask pattern according to the second preferred embodiment of the present invention.

FIG. 7 is a diagram showing an another mask pattern according to the second preferred embodiment of the present invention. A plurality of line patterns 32 are formed along the side of the mask pattern 30. A pitch P7 is a space between the side of the mask pattern 30 and the closest line pattern 32 to the side of the mask pattern 30. A width W7 of the line pattern 32 and the pitch P7 are set under a resolution limit of the exposure apparatus.

The bump of the side region of the alignment mark when the alignment mark has a plurality of the line patterns 32 is more gradual than the bump of the side region of the alignment mark when the alignment mark has only one line pattern 32.

Next, manufacturing process steps of the alignment mark structure 1 are described. FIGS. 8(a) through 8(d) are cross-sectional views showing a method of manufacturing an alignment mark structure according to the present invention. In this example, a mask pattern as shown in FIG. 6 is used as a mask pattern.

Figure 8A:
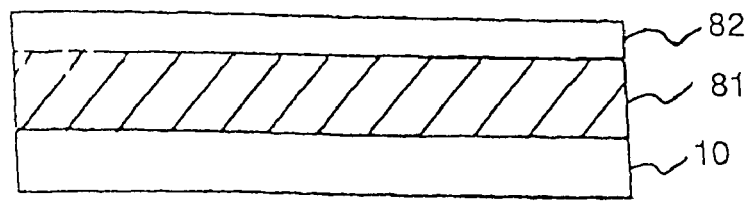
FIGS. 8(a) through 8(d) are cross-sectional views showing a method of manufacturing an alignment mark structure according to the present invention.

As shown in FIG. 8(a), a coated layer 81 and a resist layer 82 are formed over the upper layer 10 in turn.

Figure 8B:
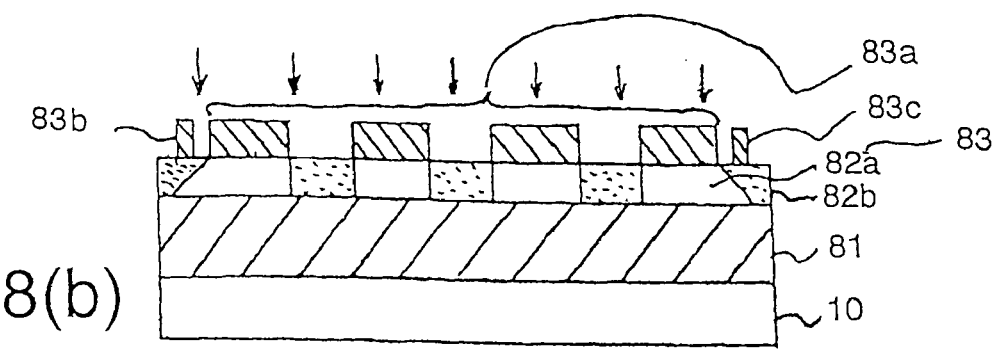

Next, as shown in FIG. 8(b) and as described in part with reference to FIG. 1 also, a mask pattern 83 including a central portion 83a, a first elongate strip portion 83b and a second elongate strip portion 83c, is formed over the resist layer 82. The central portion 83a has opposite first and second sides 4a and 4b, which extend parallel to each other. The first elongate strip portion 83b extends lengthwise parallel to and spaced from the first side 4a of the central portion 83a. Also, the second elongate strip portion 83c extends lengthwise parallel to and spaced from the second side 4b of the central portion 83a. A width of the first and second strip portions 83b and 83c and a spacing from the first and second strip portions 83b and 83c to the central portion 83a are less than a resolution limit of an exposure apparatus. Further, an exposure and a development of the resist layer 82 are performed using such a mask pattern 83 as a mask. As a result, the resist layer 82 is classified into an exposed portion 82b and the other portion 82a.

Figure 8C:
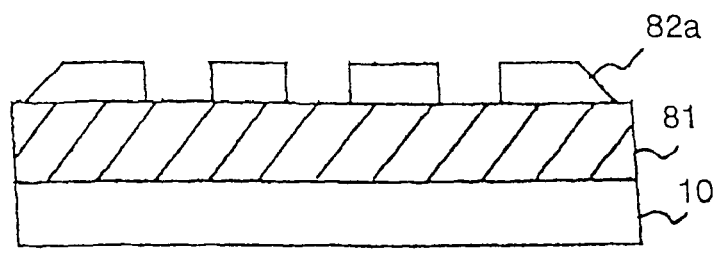

Next, as shown in FIG. 8(c), the mask pattern 83 including the central portion 83a and the first and second elongate strip portion 83b and 83c, and the exposed portion 82b of the resist layer 82, are removed.

Figure 8D:
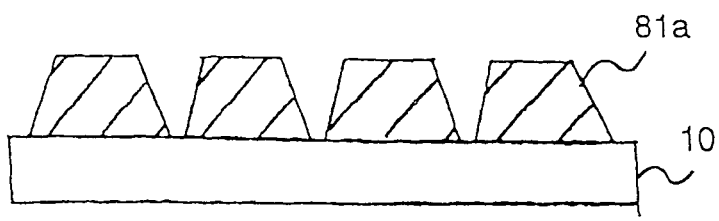

Finally, as shown in FIG. 8(d), an etching of the coated layer 81 is performed by using a remaining portion 82a (the other portion 82a) of the resist layer 82 as a mask. As a result, an alignment mark structure 81a is generated.

A material of the coated layer 81 is selected in accordance with a material and a use of the upper layer 10. When the upper layer 10 is formed by the electrical conductive material, for example, a poly-silicon is selected as the coated layer 81. On the other hand, when the coated layer 81 is formed by the insulating material, for example, a silicon dioxide is selected as the coated layer 81.

The remaining resist pattern 82b indicates the alignment mark structure 1. Also, the remaining resist pattern 82b remains around both sides 22a and 22b of the mask pattern 20 (the mask pattern 30), since the pitch P1 between the first and second wall portions 5a and 5b, and the width W6 (W7) of the elongate strip portion and the pitch P6 (the pitch P7) between the central portion and the elongate strip portion, are set under the resolution limit of the exposure apparatus.

Figure 4:
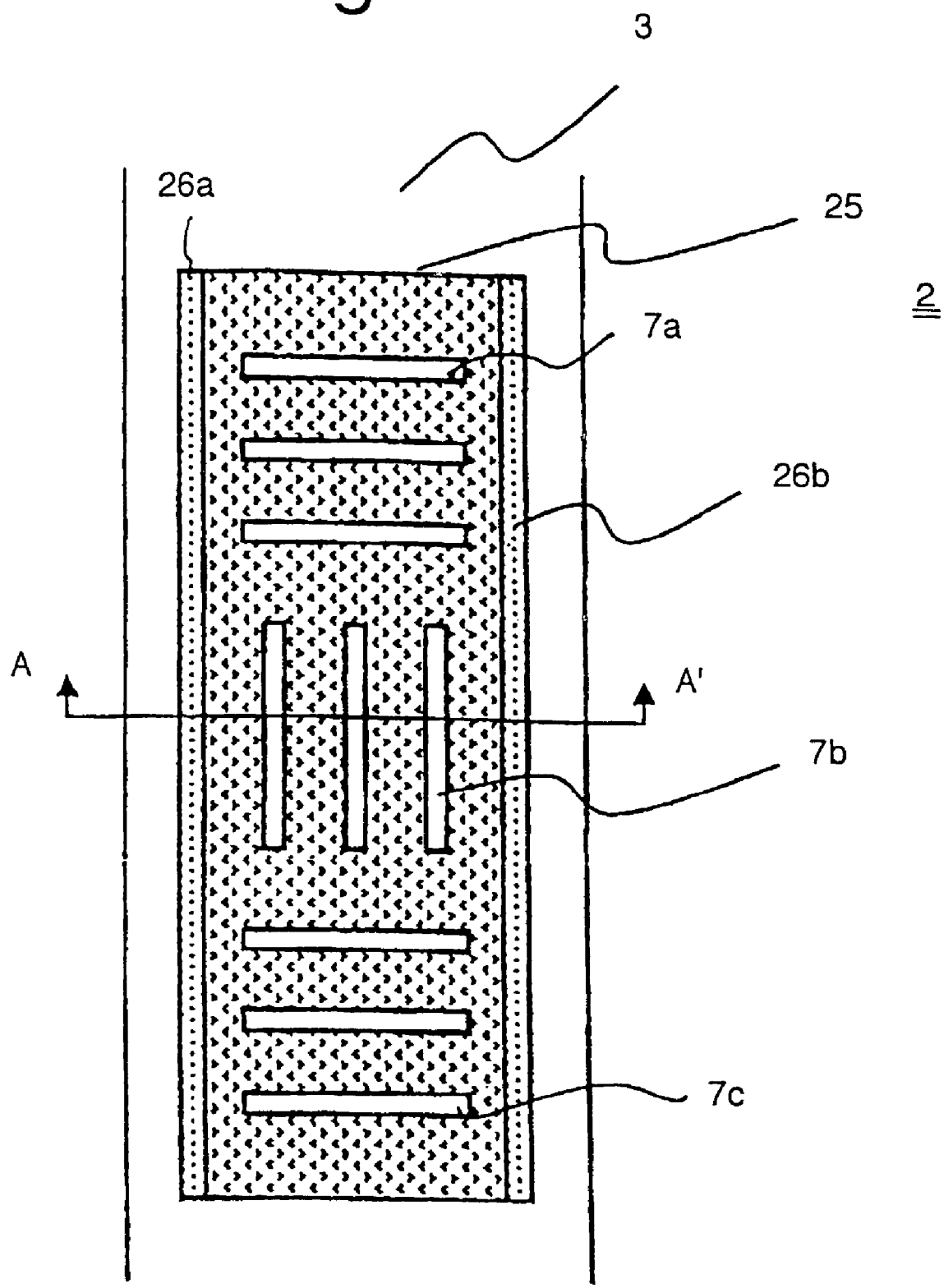
FIG. 4 is a plan view showing an alignment mark according to the second preferred embodiment of the present invention.

FIG. 4 is a plan view showing an alignment mark structure according to the second preferred embodiment of the present invention, and more particularly an alignment mark structure 25 after an etching of the coated layer is performed using the resist pattern as a mask. First and second outer wall portions 26a and 26b of the alignment mark structure 25 are configured as a gradual bump. The alignment mark structure 25 includes a plurality of sub-patterns 7a, 7b and 7c. Similar to the first preferred embodiment, each sub-patterns 7a, 7b and 7c includes several (e.g., three) regularly spaced and elongate openings extending lengthwise in a direction parallel to each other.

Figure 5A:
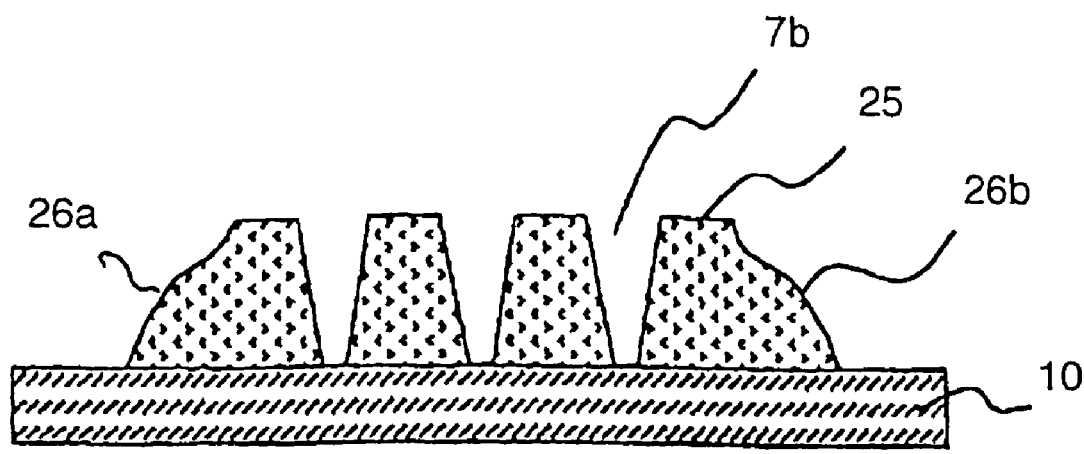
FIGS. 5(a) and 5(b) are a cross-sectional view and an alignment waveform showing the alignment mark structure according to the second preferred embodiment of the present invention.
Figure 5B:
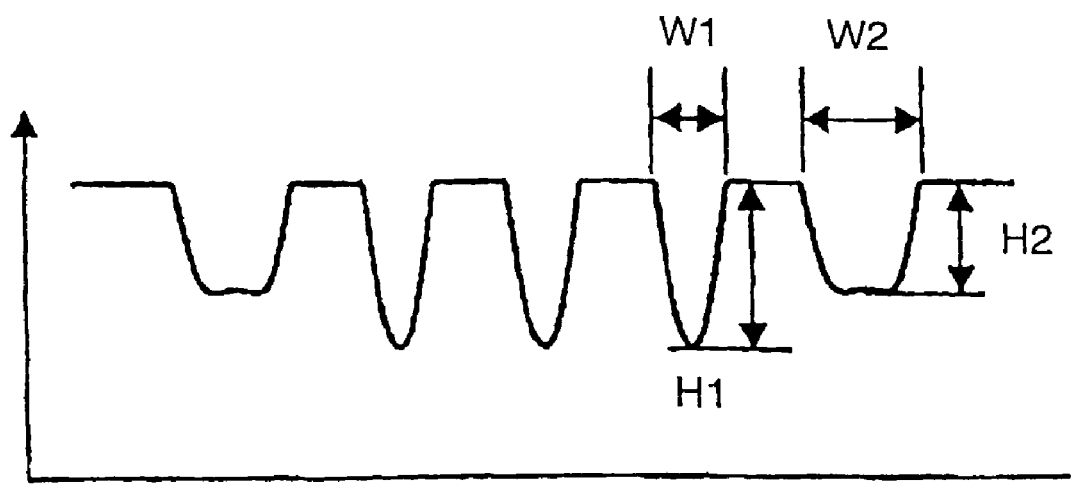

FIGS. 5(a) and 5(b) are a cross-sectional view and an alignment waveform showing the alignment mark structure according to the second preferred embodiment of the present invention.

FIG. 5(a) is a cross-sectional view along the line A–A' in FIG. 4. As shown in FIG. 5(a), bumps of the first and second outer wall portions 26a and 26b are more gradual than that of the sub-pattern 7b. When the exposure apparatus detects the alignment mark structure 25 which has such an gradual bump, the exposure apparatus recognizes a dim contrast in the first and second wall portions 26a and 26b.

FIG. 5(b) is an alignment waveform of the alignment mark structure 25. A peak height H1 indicates a height of the bump of the sub-pattern 7b, and a peak height H2 indicates a height of the bump of the first and second outer wall portions 26a and 26b. As shown in FIG. 5(b), the peak height H2 of the first and second outer wall portions 26a and 26b is shorter than the peak height H1 of the sub-pattern 7b. More further, a peak width W2 of the alignment waveform of the first and second outer wall portions 26a and 26b is wider than a peak width W1 of the alignment waveform of the sub-pattern 7b. As a result, the exposure apparatus does not incorrectly recognize the diffracting and scattering of light arising from the first and second outer wall portions 26a and 26b of the alignment mark structure 25, as a substitute for the diffracting and scattering of light arising from the sub-pattern 7b.

According to the second preferred embodiment of the present invention, since a pair of the sides of the mask pattern 20 are consisted such that the first and second portions 21a and 21b are alternatively and sequentially located, and also since the width (W6 or W7) of the elongate strip portion 32 and the pitch (P6 or P7) from the central portion to the elongate strip portion 32 of the alignment mark structure 25 are set under the resolution limit of the exposure apparatus, the first and second outer wall portions 26a and 26b of the alignment mark structure 25 are consisted by a gradual bump. Therefore, since the peak height H2 of the first and second outer wall portions 26a and 26b is different from the peak height H1 of the sub-pattern 7b, the exposure apparatus can carry out a correct alignment using the alignment mark structure 25.

As described above, since a pair of sides of the alignment mark are consisted such that first and second wall portions are alternatively and sequentially located, the exposure apparatus can carry out a correct alignment using the alignment mark structure of the present invention. More further, since a bump of the first and second outer wall portions of the alignment mark is more gradual than that of the sub-pattern, the exposure apparatus can correctly align due to using such an alignment mark of the present invention.

The present invention has been described with reference to illustrative embodiments, however, this invention must not be considered to be confined only to the embodiments illustrated. Various modifications and changes of these illustrative embodiments and the other embodiments of the present invention will become apparent to those skilled in the art with reference to the description of the present invention. It is therefore contemplated that the appended claims will cover any such modifications or embodiments as fall within the true scope of the invention.

The invention claimed is:

1. A semiconductor substrate having an upper layer and an alignment mark structure formed on a surface region of the upper layer, the surface region defined by opposite first and second parallel sides extending along the upper layer, wherein the alignment mark structure comprises:
   a first outer side wall extending upwardly from the upper layer and extending lengthwise along the first side of the surface region, wherein the first outer side wall is defined lengthwise by alternating first and second wall portions, wherein each of the first wall portions is spaced farther from the first side of the surface region than each of the second wall portions;
   a second outer side wall extending upwardly from the upper layer and extending lengthwise along the second side of the surface region, wherein the second outer side wall is defined lengthwise by alternating third and fourth wall portions, wherein each of the third wall portions is spaced farther from the second side of the surface region than each of the fourth wall portions; and
   an alignment pattern defined by openings in the alignment mark structure located between the first and second outer side walls,
   wherein the alignment mark structure has a continuous periphery.

2. The semiconductor substrate as claimed in claim 1, wherein the alignment pattern is defined by plural sub-patterns, wherein each sub-pattern includes plural regularly spaced and elongate openings extending lengthwise in a direction parallel to each other.

3. The semiconductor substrate as claimed in claim 2, wherein the plural sub-patterns are spaced apart and aligned between the first and second outer side walls.

4. The semiconductor substrate as claimed in claim 3, wherein plural openings of each sub-pattern extend lengthwise at a right angle relative to the plural openings of each adjacent sub-pattern.

5. The semiconductor substrate as claimed in claim 4, wherein the plural openings of each sub-pattern extend either parallel to or perpendicular to the first and second sides of the surface region of the semiconductor substrate.

6. The semiconductor substrate as claimed in claim 1, wherein the surface region of the upper layer is located within a grid line formed in a surface of the semiconductor substrate.

7. A semiconductor substrate having an upper layer and an alignment mark structure formed on a surface region of the upper layer, the surface region defined by opposite first and second parallel sides extending along the upper layer, wherein the alignment mark structure comprises:
   a first outer side wall extending upwardly from the upper layer and extending lengthwise along the first side of the surface region;
   a second outer side wall extending upwardly from the upper layer and extending lengthwise along the second side of the surface region; and
   an alignment pattern defined by openings in the alignment mark structure located between the first and second outer side walls, wherein at least one of the openings is an elongate opening extending lengthwise in a first direction parallel to the first and second sides of the surface region of the upper layer,
   wherein the first outer side wall is configured such that a first distance in a second direction between a first elongate portion of the elongate opening and the first outer side wall is smaller than a second distance in the second direction between a remaining second elongate portion of the elongate opening and the first outer side wall,
   wherein the alignment mark structure has a continuous periphery.

8. The semiconductor substrate as claimed in claim 7, wherein a difference between the first and second distances is within a range of 5 µm to 10 µm.

9. The semiconductor substrate as claimed in claim 7, wherein the alignment pattern is defined by plural sub-patterns, wherein each sub-pattern includes plural regularly spaced and elongate openings extending lengthwise in a direction parallel to each other.

10. The semiconductor substrate as claimed in claim 9, wherein the plural sub-patterns are spaced apart and aligned between the first and second outer side walls.

11. The semiconductor substrate as claimed in claim 10, wherein plural openings of each sub-pattern extend lengthwise at a right angle relative to the plural openings of each adjacent sub-pattern.

12. The semiconductor substrate as claimed in claim 11, wherein the plural openings of each sub-pattern extend either parallel to or perpendicular to the first and second sides of the surface region of the semiconductor substrate.

13. The semiconductor substrate as claimed in claim 7, wherein the surface region of the upper layer is located within a grid line formed in a surface of the semiconductor substrate.

* * * * *